United States Patent
Faul et al.

(10) Patent No.: US 10,466,126 B2
(45) Date of Patent: Nov. 5, 2019

(54) MEMS CAPACITIVE PRESSURE SENSORS IN FULLY DEPLETED SEMICONDUCTOR ON INSULATOR (FDSOI)

(71) Applicant: GLOBALFOUNDRIES INC., Grand Cayman (KY)

(72) Inventors: Juergen Faul, Radebeul (DE); Frank Jakubowski, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/906,368

(22) Filed: Feb. 27, 2018

(65) Prior Publication Data

US 2019/0265117 A1    Aug. 29, 2019

(51) Int. Cl.
*G01L 9/00* (2006.01)
*B81B 3/00* (2006.01)
*B81C 1/00* (2006.01)

(52) U.S. Cl.
CPC .......... *G01L 9/0073* (2013.01); *B81B 3/0021* (2013.01); *B81C 1/00158* (2013.01); *B81B 2201/0264* (2013.01); *B81B 2203/0127* (2013.01); *B81B 2203/0315* (2013.01); *B81B 2203/04* (2013.01); *B81C 2201/0133* (2013.01); *B81C 2201/0161* (2013.01)

(58) Field of Classification Search
None
See application file for complete search history.

(56) References Cited

U.S. PATENT DOCUMENTS

| | | | | |
|---|---|---|---|---|
| 6,640,642 B1* | 11/2003 | Onose | ..................... | G01L 1/146 73/718 |
| 2001/0029072 A1* | 10/2001 | Kuwahara | ......... | H01L 21/02032 438/151 |
| 2007/0057355 A1* | 3/2007 | Barlocchi | ......... | B01L 3/502707 257/678 |
| 2013/0062713 A1* | 3/2013 | Sakuragi | ............... | G01L 9/0042 257/419 |
| 2014/0054730 A1* | 2/2014 | Graham | ................ | B81B 3/0021 257/415 |
| 2017/0178914 A1 | 6/2017 | Prasad et al. | | |

OTHER PUBLICATIONS

Artmann et al., "Monocrystalline Si membranes for pressure sensors fabricated by a novel surface micromachining process using porous silicon", Proceedings of SPIE, 2003, 7 pages.
Kiihamaki et al., "Plug-up"—a new concept for fabricating SOI MEMS devices, Microsystem Technologies 10, 2004, 2 pages.
Fischer et al., "Integrating MEMS and ICs", Microsystems & Nanoengineering, IECAS, 2015, vol. 1, 16 pages.

* cited by examiner

*Primary Examiner* — Erik Kielin
(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to pressure sensors and methods of manufacture. The structure includes: a top membrane of semiconductor material having edges defined by epitaxial material and a liner material; a back gate under the top membrane; and a cavity defined between the top membrane and the back gate.

10 Claims, 5 Drawing Sheets

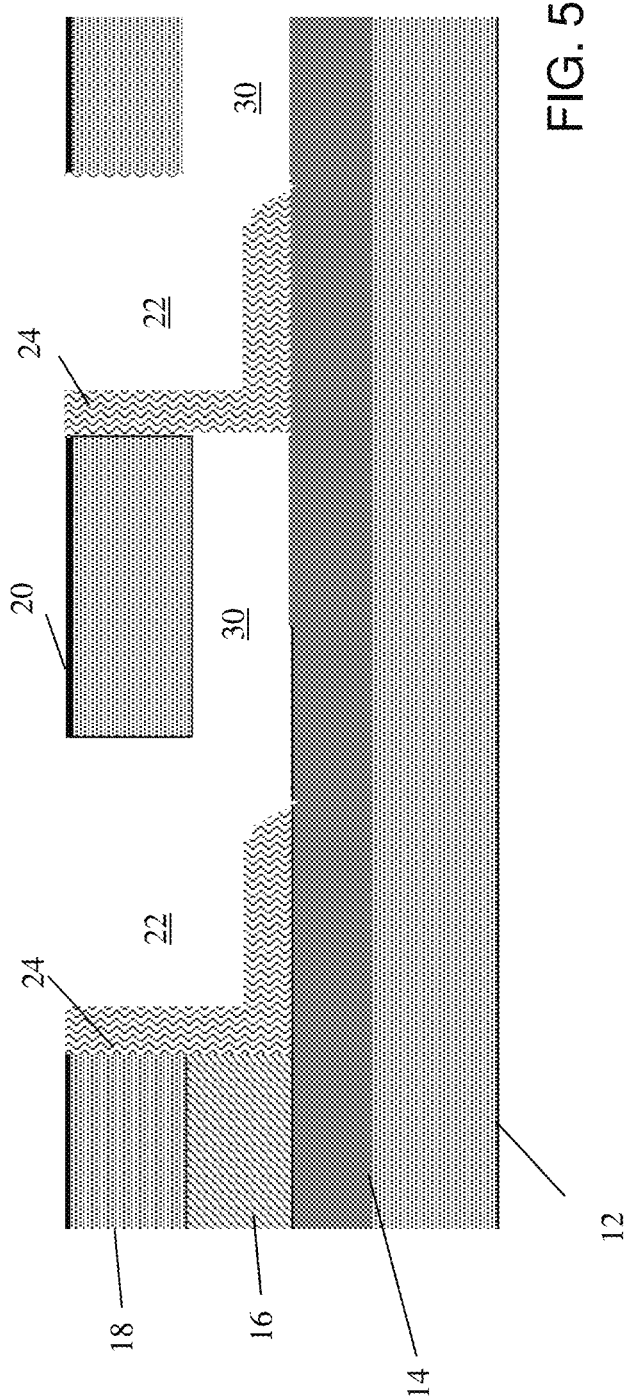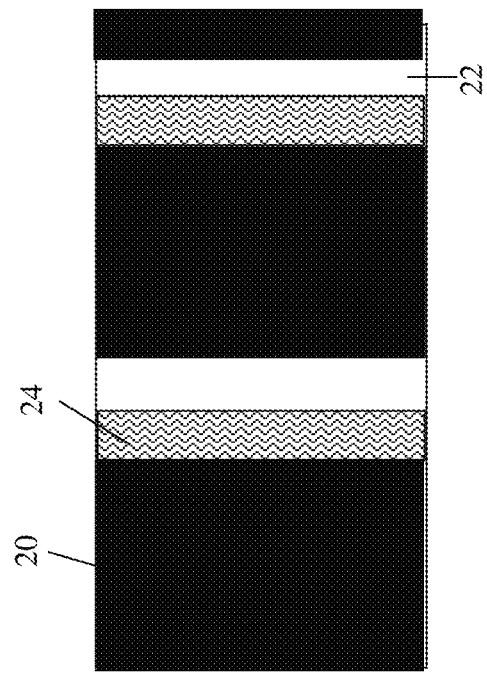

MEMS CAPACITIVE PRESSURE SENSORS IN FULLY DEPLETED SEMICONDUCTOR ON INSULATOR (FDSOI)

FIELD OF THE INVENTION

The present disclosure relates to semiconductor structures and, more particularly, to pressure sensors and methods of manufacture.

BACKGROUND

Pressure sensors can be used for control and monitoring of devices or to indirectly measure variables. For example, a pressure sensor usually acts as a transducer, generating an electrical signal as a function of the pressure imposed on the sensor.

Pressure sensors can vary drastically in technology, design, performance, application suitability and cost. For example, a capacitive pressure sensor uses a diaphragm, e.g., membrane or plate, to create a variable capacitor to detect strain due to applied pressure. In these systems, capacitance decreases as pressure deforms the diaphragm.

The capacitive pressure sensor can be fabricated using CMOS technologies. For example, using lithography, etching and deposition processes, a MEMS capacitor can be fabricated as a capacitive pressure sensor. In such a sensor, the top membrane of the MEMS capacitor is formed over a cavity structure, with the cavity structure above a bottom membrane (or plate). In this type of application, one or both of the membranes, for example, can be deflected into the cavity under an applied pressure, providing a change in capacitance between the two membranes. However, current fabrication processes cannot provide well-defined edges of the pressure sensor, leading to inaccurate readings and measurements.

SUMMARY

In an aspect of the disclosure, a structure comprises: a top membrane of semiconductor material having edges defined by epitaxial material and a liner material; a back gate under the top membrane; and a cavity defined between the top membrane and the back gate.

In an aspect of the disclosure, a structure comprises: a top membrane of semiconductor material having it edges defined by epitaxial material and a liner material; a bottom membrane of doped bulk semiconductor material; and a cavity defined by the top membrane and the bottom membrane, with its edges defined by the epitaxial material on one edge and the liner material on remaining edges.

In an aspect of the disclosure, a method comprises: forming a slit in a top membrane of semiconductor material and underlying insulator material, exposing a back gate; lining the slit with a liner material; damaging the liner material on at least one sidewall of the slit; removing the damaged liner material to expose the underlying insulator material; removing the underlying insulator material by an under etching process to form a cavity between the top membrane and the back gate; and growing epitaxial material in the slit to close the cavity.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 5A shows a cut-away view of the slit and a cavity structure under a top membrane, amongst other features, and respective fabrication processes in accordance with aspects of the present disclosure.

FIG. 5B shows a top view of the structure of FIG. 5A.

DETAILED DESCRIPTION

Figure 1:
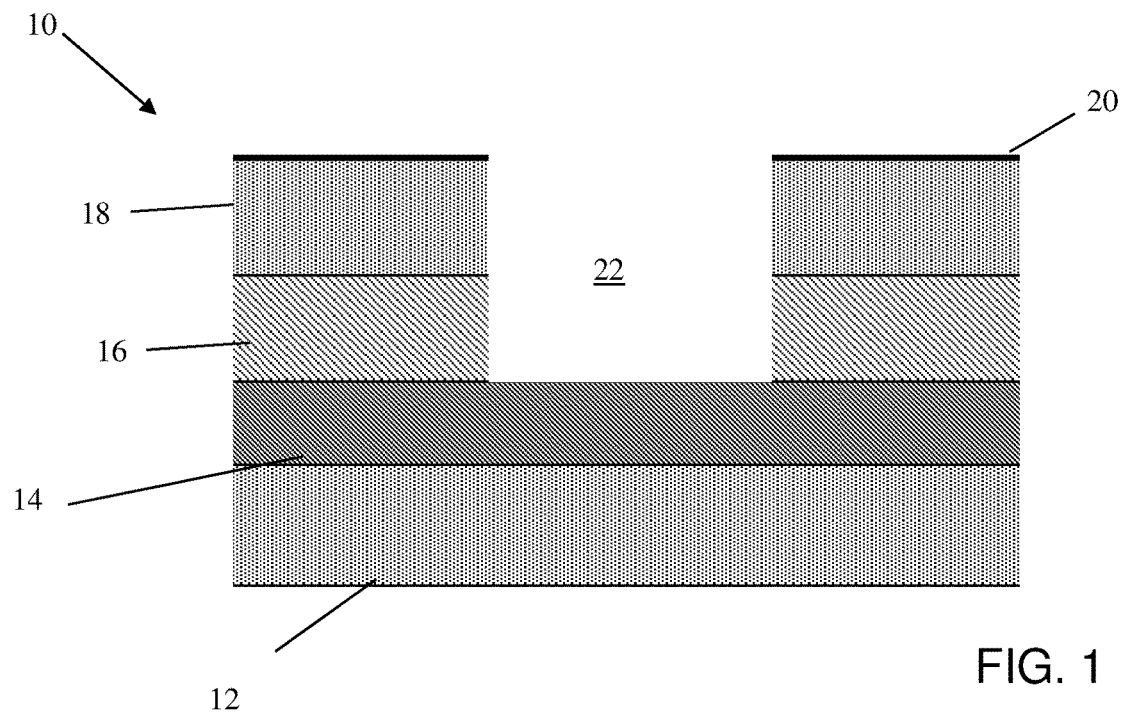
FIG. 1 shows an incoming structure with a slit, amongst other features, and respective fabrication processes in accordance with aspects of the present disclosure.

The present disclosure relates to semiconductor structures and, more particularly, to pressure sensors and methods of manufacture. More specifically, the present disclosure relates to MEMS capacitive pressure sensors in fully depleted semiconductor on insulator (FDSOI) and methods of manufacture. Advantageously, the pressure sensors (e.g., MEMS capacitive pressure sensor) have a well-defined perimeter or edges, made possible by employing a single sided opened liner hardmask. In more specific embodiments, the pressure sensors have a well-defined capacitor geometry and well-defined thin top electrodes or membranes.

In embodiments, the methods described herein include forming a pressure sensor (e.g., MEMS capacitive pressure sensor) on SOI. In embodiments, the pressure sensor can be integrated into CMOS SOI process flows (e.g., SoC, monolithic integration) and, preferably, FDSOI process flows. In embodiments, the MEMS capacitive pressure sensor can be formed on BULK Si prior to or after back end of line (BEOL) processes. And, unlike conventional pressure sensors, the perimeter of the pressure sensors described herein are well-defined which is possible by employing a single sided opened liner hardmask. The pressure sensors described herein can be implemented in many different applications including for Internet of Things (IoT) applications required to record environment parameters.

In embodiments, the pressure sensors are integrated into CMOS SOI process flows, preferably FDSOI process flows. The fabrication processes comprise, for example, defining an active region of the sensor membrane (top electrode or membrane of the capacitor sensor (MEMS)) together with the definition of all other active regions on the wafer. This can be provided by forming a slit through the semiconductor material and BOX material, with an optional merging into already used FDSOI processes. The fabrication processes further comprise lining the slit with a liner material and damaging a portion of the liner material e.g. SiN, SiO$_2$, a-Si or combinations, provided within the slit. The damaging can occur by an implantation process, e.g., by a tilted implant (maskless or masked).

Following the ion implantation, the damaged liner portions can be removed by wet etch processes utilizing the different etch rates between the damaged and undamaged liner material. The BOX underneath the top membrane, e.g., silicon layer, is exposed by the removal of the damaged liner, which can then be removed by a wet HF etching process. The slit can be closed by epi overgrowth in a vacuum after removal of the liner material on the bulk wafer surface during an epitaxy preclean process. The pressure sensor can also have same doping polarities in the back gate and the sensor membrane (e.g. n+ on n-back gate or p+ on p-back gate) or, alternatively, different doping polarities in the back gate and the sensor membrane (e.g. n+ on p-back gate or p+ on n-back gate).

The pressure sensors of the present disclosure can be manufactured in a number of ways using a number of different tools. In general, though, the methodologies and tools are used to form structures with dimensions in the micrometer and nanometer scale. The methodologies, i.e., technologies, employed to manufacture the pressure sensors of the present disclosure have been adopted from integrated circuit (IC) technology. For example, the structures are built on wafers and are realized in films of material patterned by photolithographic processes on the top of a wafer. In particular, the fabrication of the pressure sensors uses three basic building blocks: (i) deposition of thin films of material on a substrate, (ii) applying a patterned mask on top of the films by photolithographic imaging, and (iii) etching the films selectively to the mask.

FIG. 1 shows an incoming structure and respective fabrication processes in accordance with aspects of the present disclosure. Specifically, the incoming structure 10 includes a BULK substrate 12, e.g., BULK Si. A buried oxide layer (BOX) 16 can be formed over the substrate 12 and a semiconductor material 18 can be formed over the BOX 16, forming a semiconductor on insulator (SOI) wafer. In embodiments, the semiconductor material 18 can be composed of any suitable material including, but not limited to, Si, SiGe, SiGeC, SiC, GaAs, InAs, InP, and other III/V or II/VI compound semiconductors.

In embodiments, the semiconductor material 18 can have a thickness of about 12 nm to about 25 nm and the BOX 16 can gave a thickness of about 20 nm (providing a sensor capacitance of about 0.44 fF/µm$^2$ for vacuum); although other thicknesses (and capacitances) are contemplated herein. For example, the semiconductor material 18 can be thinned down by a chemical mechanical process (CMP) for high performance logic FETs. As should be understood, the SOI wafer can be formed by any conventional bonding techniques including, e.g., SiMOX (Separation by IMplantation of OXygen).

An etch stop material 20 is deposited on the semiconductor material 18 using conventional deposition methods. For example, the etch stop material 20 can be oxynitride deposited by chemical vapor deposition (CVD) processes. An opening or slit 22 is formed through the semiconductor material 18 and the BOX 16 to begin the fabrication process of forming a top membrane of the sensor, e.g., top plate of a capacitive pressure sensor (e.g., MEMS) composed of the semiconductor material 18. For example, a resist formed over the etch stop material 20 is exposed to energy (light) to form a pattern (opening). An etching process with a selective chemistry, e.g., reactive ion etching (RIE), will be used to form one or more slits (openings) 22 in the etch stop material 20, the underlying semiconductor material 18 and BOX 16. The resist can then be removed by a conventional oxygen ashing process or other known stripants.

Still referring to FIG. 1, the substrate 12 is also subjected to a doping process, e.g., implantation process, to form a back gate 14 (e.g., bottom plate or membrane of a capacitor pressure sensor) together with CMOS back gates of logic FET devices. In embodiments, the back gate 14 can be an N-well/n-back gate or a P-well/p-back gate, as examples. In embodiments, the logic FET devices can also be integrated into FinFET in SOI process flows, as should be understood by those of ordinary skill in the art such that no further explanation is required for an understanding of the present disclosure.

Figure 2:
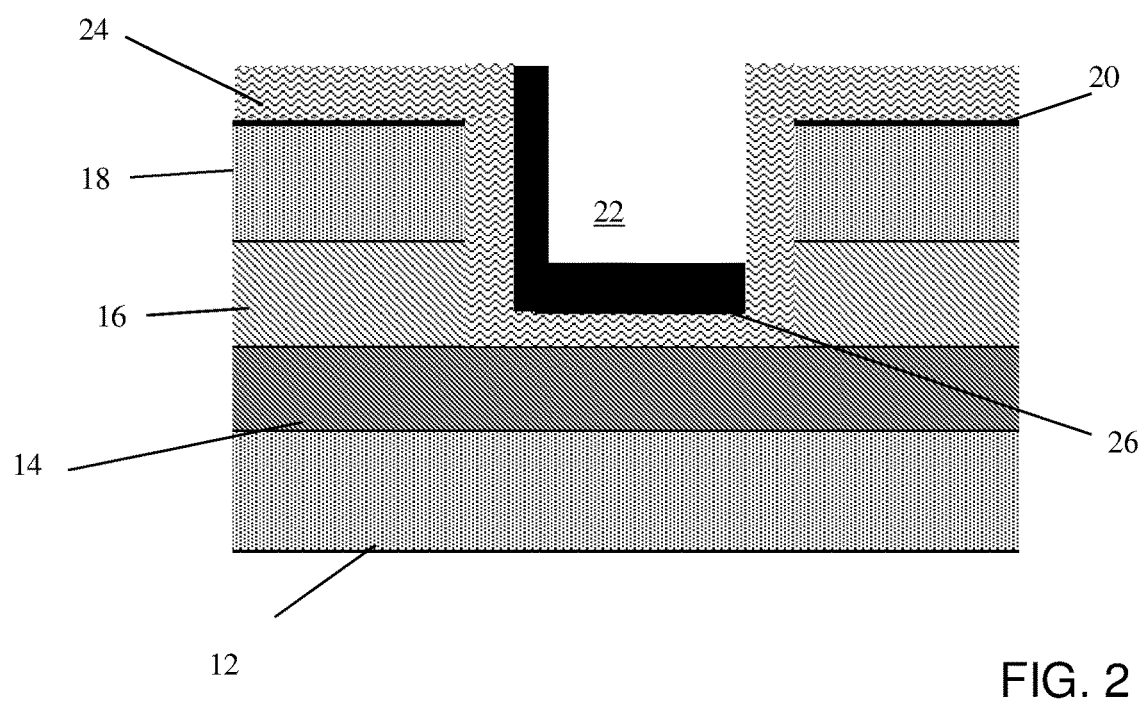
FIG. 2 shows a liner formed in the slit, amongst other features, and respective fabrication processes in accordance with aspects of the present disclosure.

In FIG. 2, a liner 24 is deposited on the etch stop material 20 and in the slit 22 (including on the back gate 14). In embodiments, the liner 24 is SiN material deposited by conventional deposition processes, e.g., CVD. In alternative embodiments, the liner 24 can be, e.g., SiO$_2$, a-Si or combinations of any of the materials described herein. The liner 24 can be deposited to a thickness of about 10 nm; although other dimensions are contemplated depending on the aspect ratio of the slit 22 (e.g., particular technology node). In optional embodiments, a mask 26 is formed (patterned) partly over the liner 24 within the slit 22, to protect a sidewall and bottom portion thereof.

Figure 3:
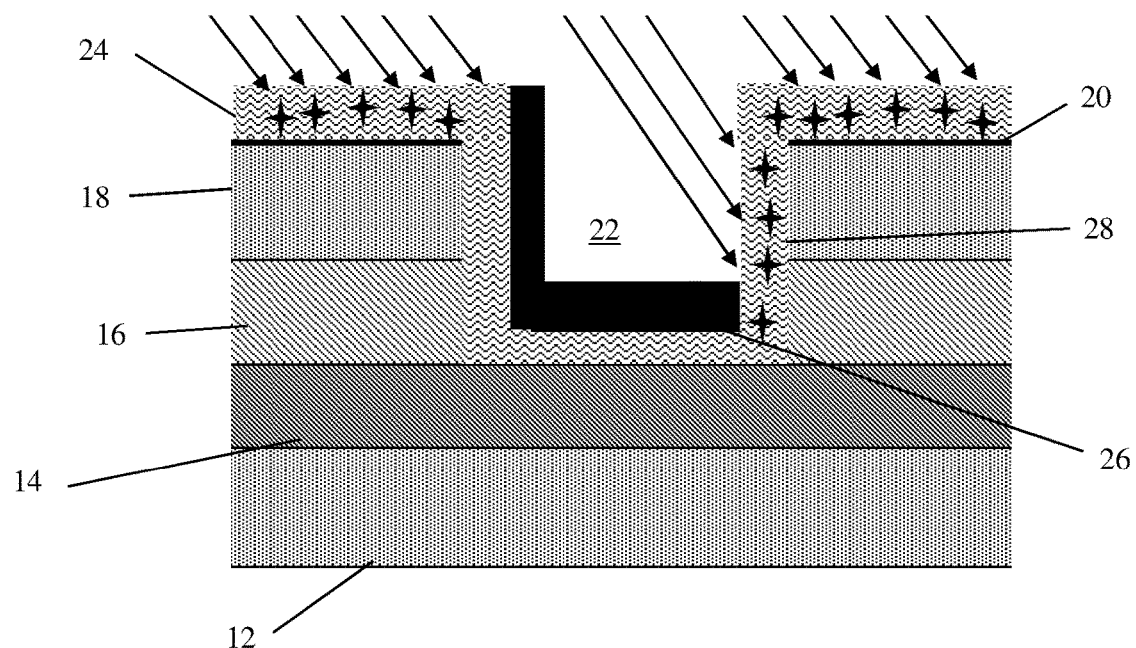
FIG. 3 shows a damaged liner on a sidewall of the slit, amongst other features, and respective fabrication processes in accordance with aspects of the present disclosure.

FIG. 3 shows an implantation process which is used to damage the liner 24, as shown by reference numeral 28. In embodiments, the implantation process can be performed with or without the optional mask 26. In using a mask, collateral implant on the opposite side of the opening (e.g., sensor) can be avoided. This will ensure that the protected liner 24 will not be removed by a subsequent wet HF etch process.

In any scenario (with or without the mask), the implantation process is preferably an angled or tilted implantation process that will damage the liner 24 on a sidewall of the slit 22. That is, with a single orientation implant only one side of the slit 22 (on the liner 24) will be implanted and, hence damaged. As should be understood by those of ordinary skill in the art, the implant process will increase the etch rate of the damaged liner 28 allowing it to be removed at a different etch rate compared to the undamaged liner 24. The implantation process can be performed with a species Si, Ar, etc., at a dose and energy that depends on the applied liner material, liner thickness and etch chemistry. In further embodiments, the tilt angle of the implantation process will be selected depending on the size of the opening and stack height of the mask 26 in order to obtain optimum shadowing, e.g., damage of the liner 24.

Figure 4:
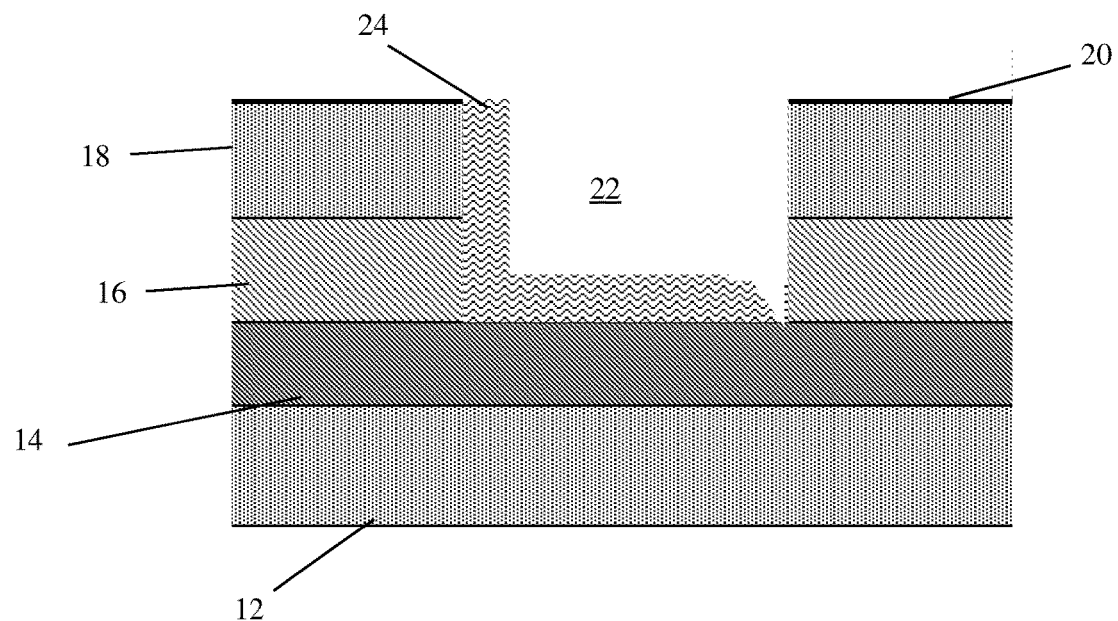
FIG. 4 shows the liner partially removed from the slit, amongst other features, and respective fabrication processes in accordance with aspects of the present disclosure.

As shown in FIG. 4, the damaged liner 28 is removed by a wet etch process at the edge of the area which becomes the pressure sensor. This wet etch process can be performed by e.g. hot H$_3$PO$_4$ or SiCoNi. By removing the damaged liner 28, the underlying BOX 16 can be exposed, which is later removed to form the top membrane of the sensor (e.g., semiconductor material 18). In the wet etching process, the undamaged liner 24 will remain at a bottom of the slit 22 and on other sidewalls thereof due to the increased etch rate of the damaged liner 28. Also, the etch stop material 20 will protect the underlying semiconductor material 18 (e.g., top membrane of the sensor) during the wet etching process. In this way, well defined edges of the sensor can be defined. In the case that a mask was used for the implantation process, such mask can also be used to protect the undamaged liner 24 during the wet etching process (which removes the damaged liner 28). The mask can be removed using conventional etchants or other stripping processes.

FIG. 5A shows a cut-away view of the slit and a cavity structure under a top membrane, amongst other features; whereas, FIG. 5B shows a top view of the structure of FIG. 5A. In FIGS. 5A and 5B, the BOX 16 under the semiconductor material 18 can be removed by an etching process. More specifically, the exposed BOX 16 will be subjected to an underetch process using an HF etching chemistry to form a cavity 30 under the semiconductor material 18. In embodiments, the cavity 30 is defined by the liner material 24 (e.g., on three sides) and part of the original slit 22. In this way, the lateral dimension of the pressure sensor is well-defined by the slit 22 and remaining liner material 24. Also, the top membrane, e.g., semiconductor material 18, remains supported by the liner material 24.

Figure 6:
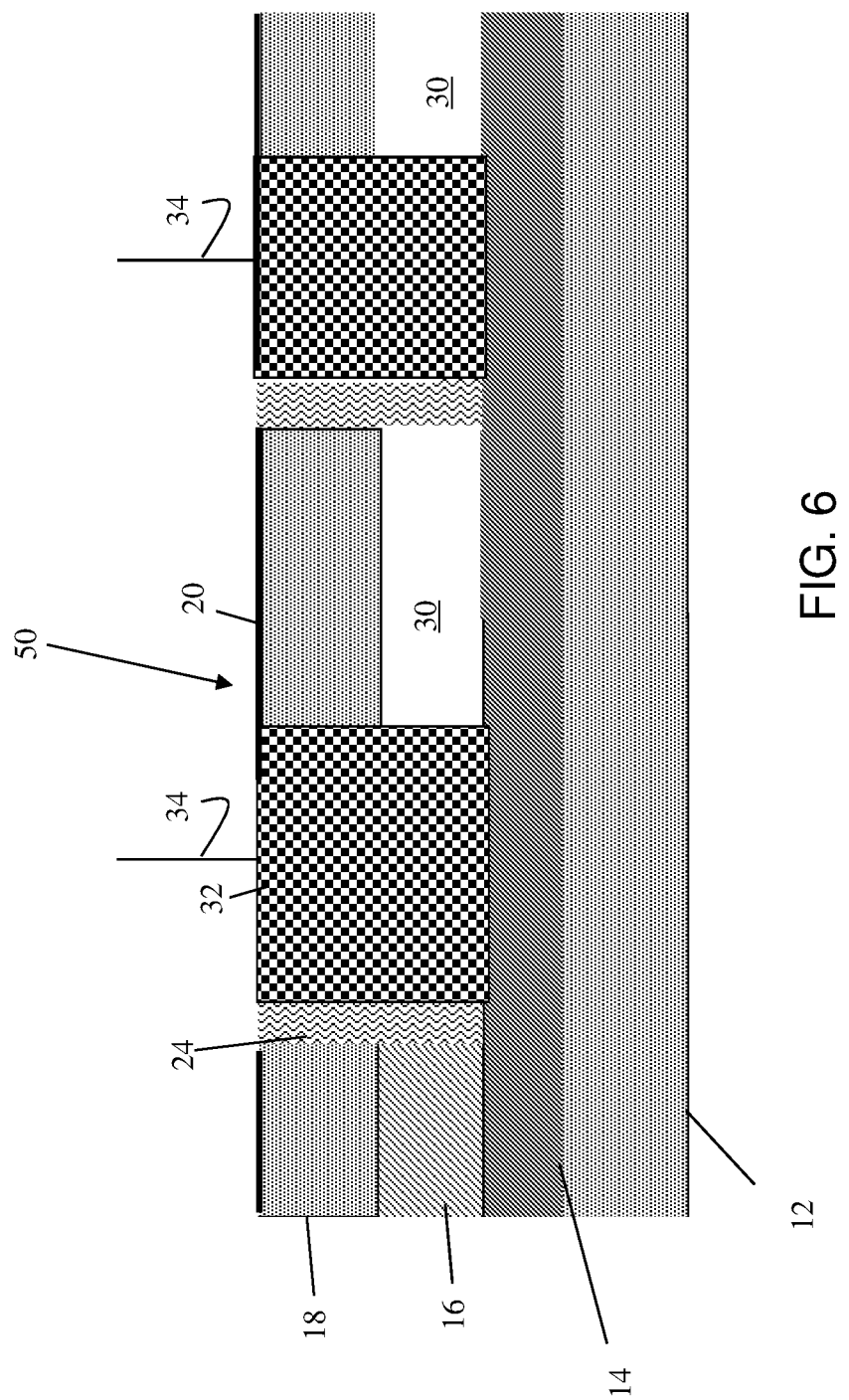
FIG. 6 shows an epitaxial material closing the slit to form a well-defined edge of a pressure sensor, amongst other features, and respective fabrication processes in accordance with aspects of the present disclosure.

As further shown in FIG. 6, an epitaxial material 32 fills in the slit 22, in direct electrical contact with the back gate 14. In this way, a pressure sensor 50 is now defined, composed of the top membrane, e.g., semiconductor material 18 supported by the liner material 24, the epitaxial material 32 and the back gate 14 (with a cavity between the top membrane and the back gate 14).

In embodiments, prior to growing the epitaxial material 32, the liner 24 on the surface of the BULK substrate 12 (e.g., on the back gate 14) is removed using an epitaxy preclean process (with a mask). Following the preclean process (and removal of the mask), an epi growth process (in a vacuum) is performed on the BULK substrate 12 (e.g., electrically contacting the back gate 14) to close the slit 22, with the epitaxial material 32. It should be recognized that the epitaxial material 32 will not grow on the etch stop material 20. Also, the epitaxial material 32 will electrically isolate the top membrane, e.g., semiconductor material 18, from the back gate 14. In embodiments, the epitaxial material 32 can be a n-/p-epi semiconductor material (depending on the polarity of the top membrane 18), which avoids electrical depletion during sensor operation.

After the growth process, the semiconductor material 18 that defines the sensor can be doped or ion implanted to form the top plate (or membrane) of the capacitor (e.g., pressure sensor). For example, the semiconductor material 18 will be oppositely doped from the epitaxial material 32 (e.g., p-type semiconductor material 18 and n-type epitaxial material 32). Other electrodes can be formed by substrate or back gate implant in FDSOI processes.

In optional embodiments, the epitaxial material 32 can be overgrown on the top membrane, e.g., semiconductor material 18, of the pressure sensor to stabilize the top membrane. This step could be combined with the slit regrowth or carried out independently by a separate masked pad nitride removal on top of the semiconductor material 18. In such case, a different epitaxial thickness can be grown on the top sensor membrane, e.g., semiconductor material 18. In embodiments, a pad nitride thickness can be optimized (and/or stripped) to leave enough SiN liner on top of the membrane to avoid slit regrowth).

After the epitaxial growth, contacts 34 can be formed at the edge of the top membrane (as shown in FIG. 6). In embodiments, the contacts 34 can be formed on the regrown epitaxial material 32, similar to drain contacts in SOI technology, e.g., lithography, etching and deposition of contact material. In embodiments, the back gate or well contact can also be formed together with well contacts required in FDSOI as part of the integration flow as contacts on hybrid wafer material.

Figure 7:
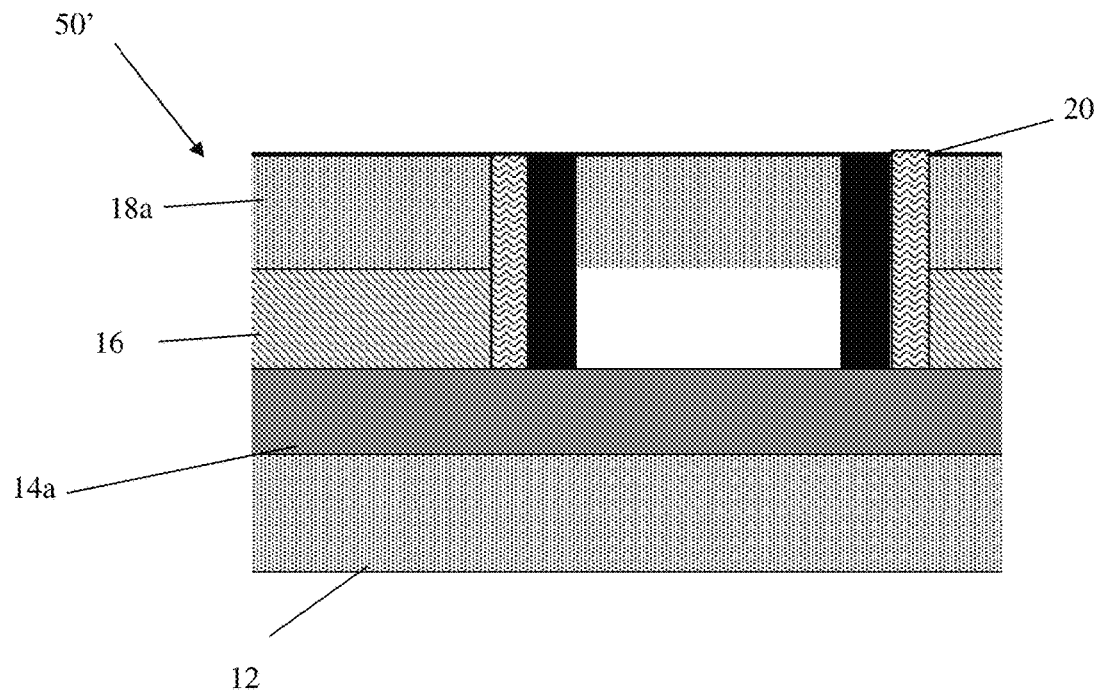
FIG. 7 shows a pressure sensor, amongst other features, and respective fabrication processes, in accordance with additional aspects of the present disclosure.
Figure 8:
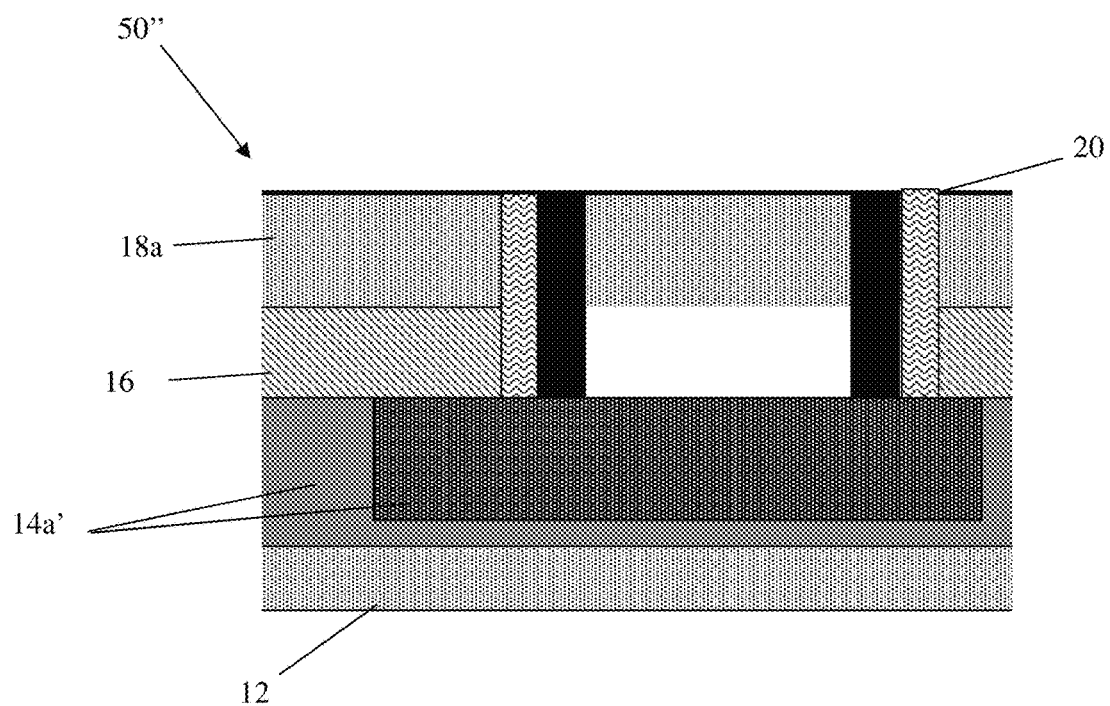
FIG. 8 shows a pressure sensor, amongst other features, and respective fabrication processes, in accordance with additional aspects of the present disclosure.

The pressure sensor can also have same doping polarities in the back gate and the sensor membrane (e.g., n+ on n-back gate or p+ on p-back gate) or, alternatively, different doping polarities in the back gate and the sensor membrane (e.g. n+ on p-back gate or p+ on n-back gate). For example, FIG. 7 represents a pressure sensor 50' with same doping polarities in the back gate 14a and sensor membrane 18a (e.g. n+ on n-back gate or p+ on p-back gate); whereas, FIG. 8 represents a pressure sensor 50" different doping polarities in the back gate and sensor membrane 18a (e.g. n+ on p-back gate or p+ on n-back gate). In embodiments, the back gate 14a' can be a p-well/p back gate in a deep n-well isolation or an n-well/n back gate in a deep p-well isolation.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a top membrane of semiconductor material having edges defined by epitaxial material and a liner material;
   a back gate under the top membrane; and
   a cavity defined between the top membrane and the back gate,
   wherein the liner material is an insulator material and the epitaxial material is a semiconductor material of a different polarity type than the top membrane.

2. The structure of claim 1, wherein the back gate is a bottom membrane of a capacitive pressure sensor, and the top membrane and the bottom membrane have a same polarity.

3. The structure of claim 1, wherein the back gate is a bottom membrane of a capacitive pressure sensor, and the top membrane and the bottom membrane have different polarities.

4. The structure of claim 1, wherein the epitaxial material is a doped epitaxially grown semiconductor material and the liner material is SiN, $SiO_2$, a-Si or combinations thereof.

5. The structure of claim 1, wherein the semiconductor material of the top membrane is semiconductor on insulator (SOI) material, and the back gate is a doped bulk semiconductor material.

6. A structure, comprising:
a top membrane of semiconductor material having edges defined by epitaxial material and a liner material;
a back gate under the top membrane; and
a cavity defined between the top membrane and the back gate,
wherein the cavity is defined by the top membrane, the bottom membrane and its edges are defined by the epitaxial material and the liner material.

7. A structure comprising:
a top membrane of semiconductor material having it edges defined by epitaxial material and a liner material;
a bottom membrane of doped bulk semiconductor material; and
a cavity defined by the top membrane and the bottom membrane, with its edges defined by the epitaxial material on one edge and the liner material on remaining edges.

8. The structure of claim 7, wherein top membrane and the bottom membrane are part of a capacitive pressure sensor, and the top membrane and the bottom membrane have a same polarity.

9. The structure of claim 7, wherein the top membrane and the bottom membrane are part of a capacitive pressure sensor, and the top membrane and the bottom membrane have different polarities.

10. The structure of claim 7, wherein the epitaxial material is a semiconductor material of a different polarity type than the top membrane.

* * * * *